United States Patent
Bauer et al.

(10) Patent No.: US 7,709,893 B2
(45) Date of Patent: May 4, 2010

(54) CIRCUIT LAYOUT FOR DIFFERENT PERFORMANCE AND METHOD

(75) Inventors: Florian Bauer, Munich (DE); Christian Pacha, Munich (DE)

(73) Assignee: Infineon Technologies AG, Neubiberg (DE)

( * ) Notice: Subject to any disclaimer, the term of this patent is extended or adjusted under 35 U.S.C. 154(b) by 112 days.

(21) Appl. No.: 11/669,704

(22) Filed: Jan. 31, 2007

(65) Prior Publication Data

US 2008/0179682 A1 Jul. 31, 2008

(51) Int. Cl.
*H01L 27/088* (2006.01)
(52) U.S. Cl. .............................. 257/350; 257/E27.062
(58) Field of Classification Search ................. 257/213, 257/288, 347–354, E27.06, E27.062; 438/149, 438/151, 156, 157, 479
See application file for complete search history.

(56) References Cited

U.S. PATENT DOCUMENTS

| | | | |
|---|---|---|---|
| 6,706,571 B1* | 3/2004 | Yu et al. ...................... | 438/157 |
| 6,924,178 B2 | 8/2005 | Beintner | |
| 6,924,560 B2 | 8/2005 | Wang et al. | |
| 6,967,351 B2 | 11/2005 | Fried et al. | |
| 6,970,373 B2 | 11/2005 | Datta et al. | |
| 6,977,837 B2 | 12/2005 | Watanabe et al. | |
| 7,138,305 B2 | 11/2006 | Datta et al. | |
| 2004/0063286 A1* | 4/2004 | Kim et al. ................... | 438/283 |
| 2004/0099885 A1* | 5/2004 | Yeo et al. .................... | 257/208 |
| 2004/0145019 A1* | 7/2004 | Dakshina-Murthy et al. .......................... | 257/349 |
| 2004/0222477 A1* | 11/2004 | Aller et al. .................. | 257/412 |
| 2005/0094434 A1 | 5/2005 | Watanabe et al. | |
| 2005/0156917 A1* | 7/2005 | Tobita ........................ | 345/204 |
| 2007/0158730 A1* | 7/2007 | Burnett et al. .............. | 257/314 |
| 2008/0079077 A1 | 4/2008 | Takeda et al. | |

FOREIGN PATENT DOCUMENTS

| | | | |
|---|---|---|---|
| WO | WO-2005119763 A1 | | 12/2005 |
| WO | WO-2005119763 A1 | * | 12/2005 |

OTHER PUBLICATIONS

Doyle, B , et al., "Tri gate fully depleted SMOS transistors: fabrication, design and layout", *Components Research TCAD, Logic Technology Development, Intel Corporation*, Hillsboro Oregon, 2003 Symposium on VLSI Technology Digest of Technical Papers,(2003),2 pgs.

Yang, Fu-Liang , et al., "35 nm CMOS FinFETS", *2002 Symposium on VLSI Technology Digest of Technical Papers*, (2002),2 pgs.

(Continued)

*Primary Examiner*—Sue Purvis
*Assistant Examiner*—Kevin Quinto
(74) *Attorney, Agent, or Firm*—Infineon Technologies Patent Department

(57) ABSTRACT

A circuit includes a plurality of first MuGFET devices supported by a substrate and having a first performance level. A plurality of second MuGFET devices is supported by the substrate and have a second performance level. The first and second devices in one embodiment are arranged in separate areas that facilitate different processing of the first and second devices to tailor their performance characteristics. In one embodiment, the circuit is an SRAM having pull down transistors with higher performance.

12 Claims, 5 Drawing Sheets

OTHER PUBLICATIONS

Yu, Bin, et al., "FinFET scaling to 10 nm gate length", *IEEE*, Strategic Technology, Advanced Micro Devices, Dept of EECS, University of Berkeley, CA,(2002),4 pgs.

"German Application Serial No. 102008 006 525.0, Office Action mailed May 15, 2008", 13 pgs.

2008-0009278, "Korean Application Serial No. 2008-0009278 , Office Action mailed Jun. 29, 2009", 4 pgs.

"Korean Application No. 1020080009278, Office Action mailed Sep. 14, 2009", 5 pgs.

Guo, Zheng, et al., "FinFET-Based SRAM Design", *ISLPED*, (Aug. 2005), 2-7.

\* cited by examiner

CIRCUIT LAYOUT FOR DIFFERENT PERFORMANCE AND METHOD

BACKGROUND

For dense array style circuit layouts, such as static random access memories (SRAMs), a small cell is desired. In a read operation, a bit line and complementary bit line are precharged to a supply voltage. An externally received read address signal is decoded, and according to the decoding result, a word line signal for the read operation is enabled. Next, cell access transistors are turned on, and the data stored in the cell is read through the bit line and the complementary bit line. Similarly, in the write operation, a write address signal is received and is decoded, and according to the decoding result, a word line signal for a write operation is enabled, and the access transistors are then turned on, and the data loaded on the bit line and the complementary bit line is stored in the cell.

To avoid over writing data in the cell and thus to increase read stability, an access transistor is usually made weaker than the corresponding pull down devices. In conventional bulk complementary metal oxide semiconductor (CMOS) layouts, the access transistor is designed with a smaller transistor width. In multi gate field effect transistor (MuGFET) technologies, a core cell area is constrained by the distance between two fins (fin pitch) and the number of fins used per device. Thus, fins are placed close together, and are similar in current driving characteristics. One of the characteristics that differentiate MuGFET layouts from convention bulk complementary metal oxide semiconductor (CMOS) layouts is the fixed pitch in which transistor fins must be placed.

One known skinny SRAM cell layout that consumes little area has a length of four fin pitches. pFET (p-type field effect transistor) devices are located in the middle of the layout, with nFET (n-type field effect transistor) devices, including pull down devices located on the sides. The electrical characteristics of this prior SRAM cell are sub-optimal. All the transistors share the same fin height, which is equivalent to the gate width in bulk CMOS. This is not optimal to achieve sufficient cell stability, especially during read and write access.

DETAILED DESCRIPTION

In the following description, reference is made to the accompanying drawings that form a part hereof, and in which is shown by way of illustration specific embodiments which may be practiced. These embodiments are described in sufficient detail to enable those skilled in the art to practice the invention, and it is to be understood that other embodiments may be utilized and that structural, logical and electrical changes may be made without departing from the scope of the present invention. The following description of example embodiments is, therefore, not to be taken in a limited sense, and the scope of the present invention is defined by the appended claims.

Figure 1:
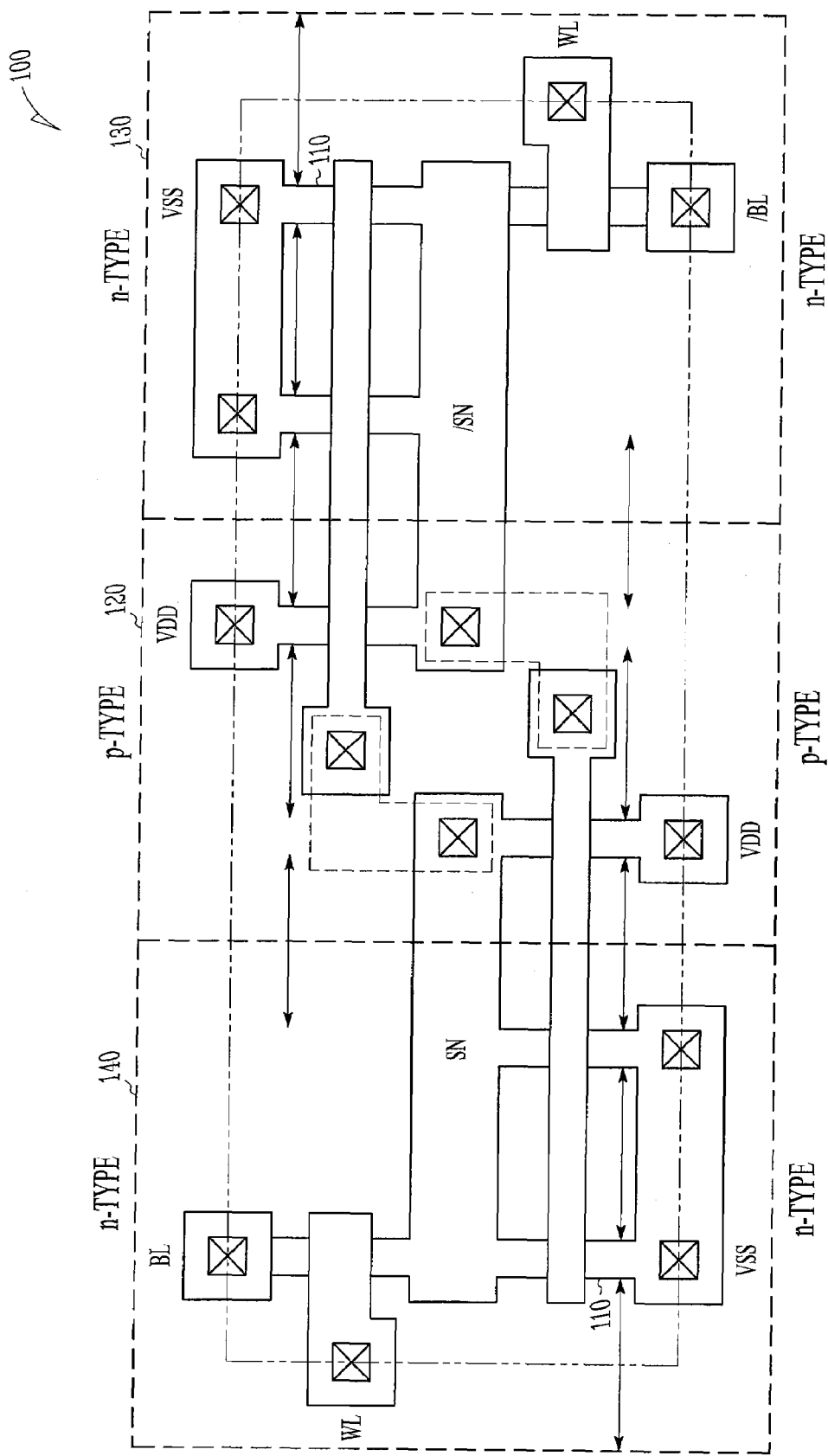
FIG. 1 is an example SRAM core cell layout having single fin and double fin devices.

A static random access memory (SRAM) device is commonly composed of six transistors, that is, two access transistors, and four transistors including pull-down transistors and pull-up transistors configured as an inverting latch. Word lines are coupled to the access transistors and data is provided or read on bit lines. In bulk CMOS, the pull-down transistor is designed with a wider gate compared to the other devices. If the same approach is employed in a multi gate field effect transistor (MuGFET) design, the cell area significantly increases as shown in FIG. 1 at 100, where the pull-down devices are realized as double fin devices 110. Continuous transistor width sizing is not available in MuGFET devices. pFET devices are located in the middle 120 of the layout 100, with nFET devices on the sides 130, 140.

The designer loses an important degree of freedom to adapt the device behavior. By changing the layout of circuits, one may influence the strength of a MuGFET device by changing the fin geometry, for example, manufacturing the fins with different heights, strain or doping.

Figure 2:
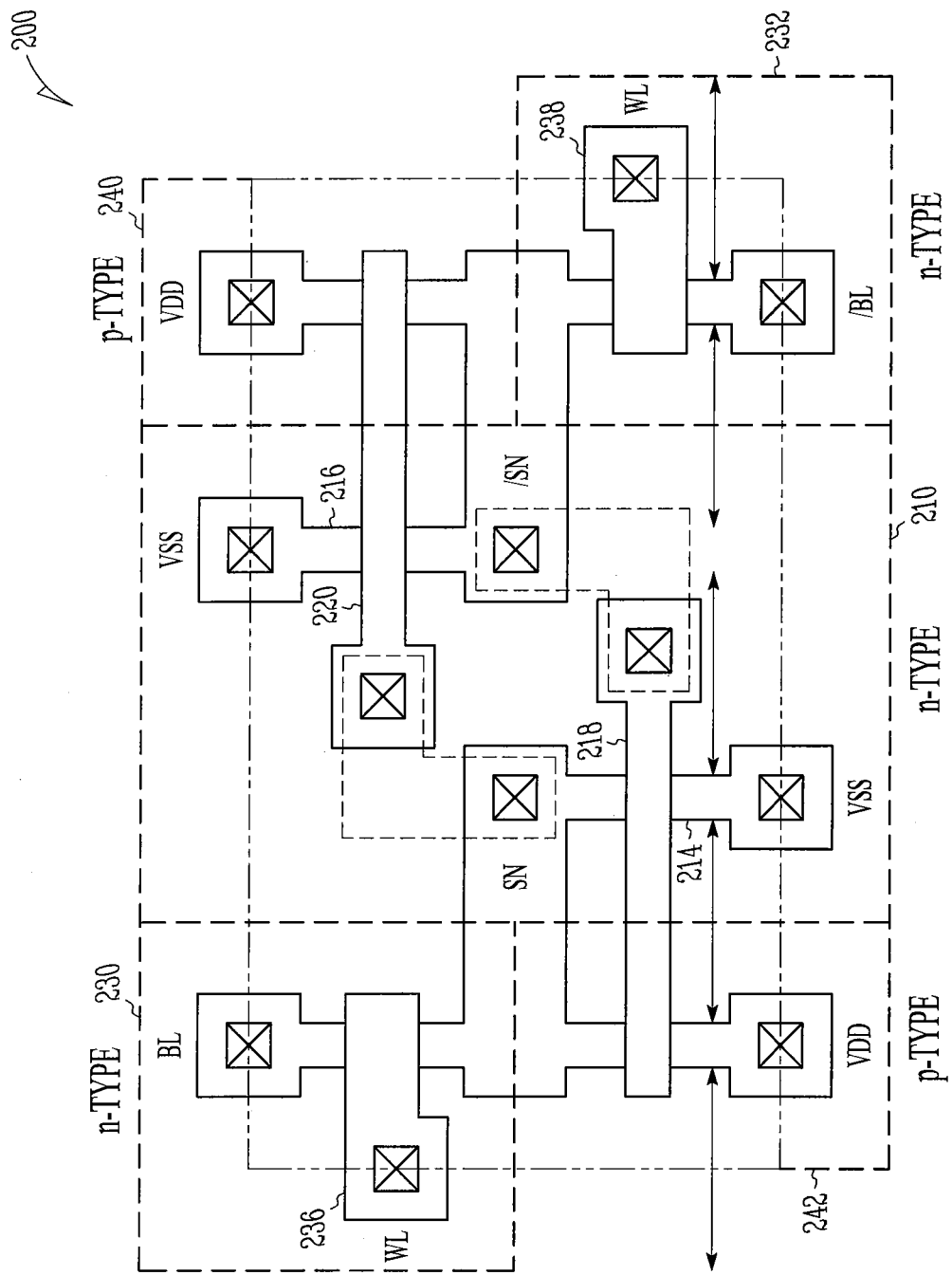
FIG. 2 is an example SRAM core cell layout having an area of devices for which different fin characteristics may be obtained according to an example embodiment.

FIG. 2 is an example core cell layout 200 having an area of MuGFET devices for which different performance characteristics may be obtained according to an example embodiment. The MuGFET devices may be produced on or supported by a substrate, either directly or by an insulator on the substrate in various embodiments. The substrate may be made of silicon, and an insulating layer such as various oxides, if used, may be formed on or supported by the substrate in various embodiments.

Cell layout 200 includes a middle portion indicated by broken line 210 that includes pull-down devices 214, 216. The pull-down devices 214, 216 are indicated by their fins, over which gates 218, 220 respectively are shown. Pull-down devices 214, 216 are coupled to ground, VSS. The pull-down devices 214, 216 may include single fin nMOS devices and may also each include multiple fins in further embodiments. Gates 218, 220 are cross coupled to respective sources of the pull down devices 214, 216. The layout of the pull-down devices 214, 216 effectively creates a stripe down the middle of the cell 200 in one embodiment, where different processing may be used to modify the current driving characteristics of the pull-down devices.

nFET access devices 230, 232 are formed in opposite corners of cell layout 200 with corresponding word lines 236, 238. pFET pull-up devices 240, 242 are located in the other opposite corners of cell layout 200 and are coupled to the supply, VDD. They share gate lines 218, 220 with the pull-down devices.

Figure 3:
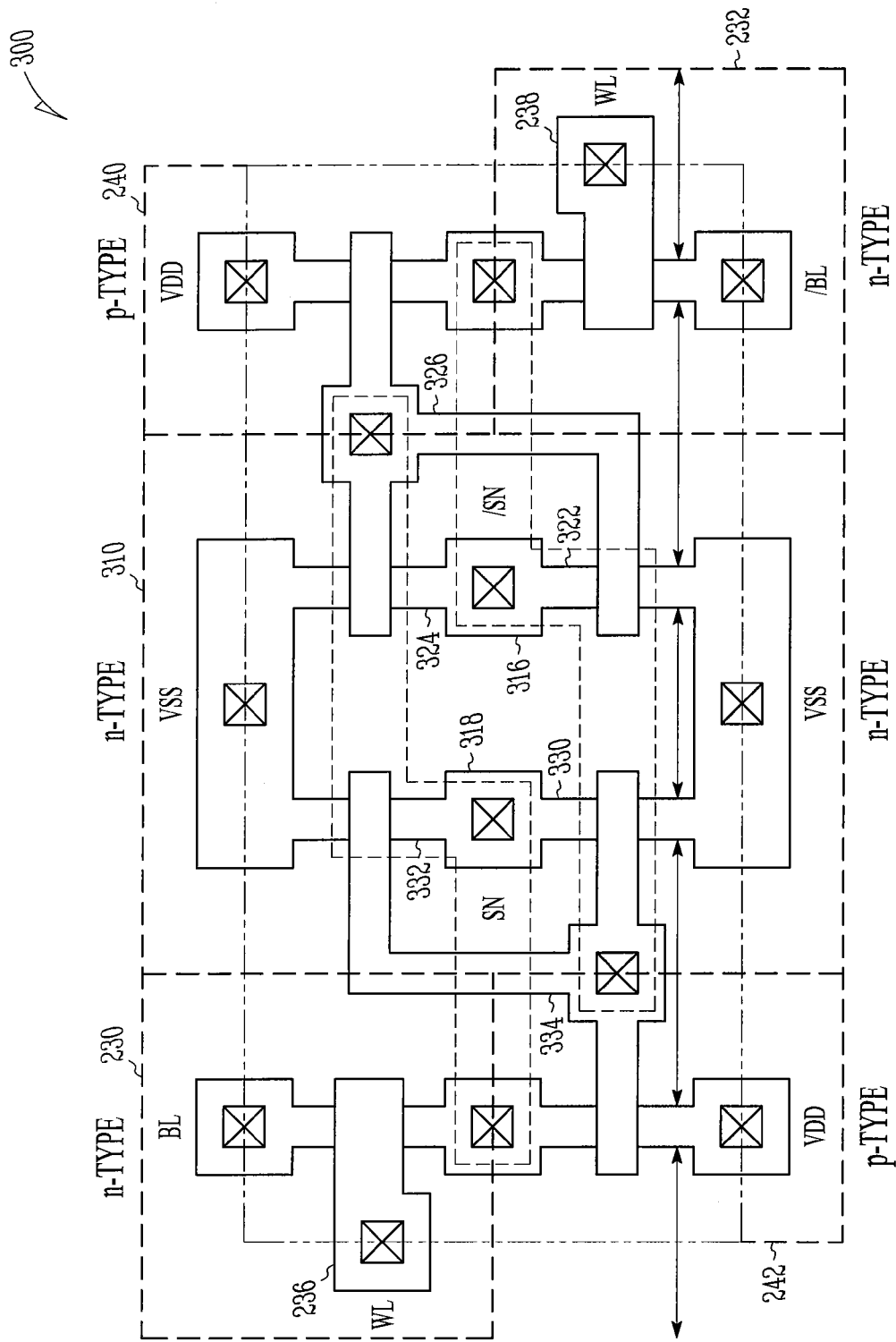
FIG. 3 is an alternative example SRAM core cell layout having an area of devices for which different fin characteristics may be obtained according to an example embodiment.

FIG. 3 is an alternative example core cell layout 300 having an area of devices indicated by broken line 310 for which different fin characteristics may be obtained according to an example embodiment. In one embodiment, double fin pull down devices 316, 318 are located within broken line 310 forming a column of devices which may be formed with current driving capabilities different from devices outside the column. In layout 300, device 316 has fins 322, 324 coupled by a gate 326. Device 318 has fins 330, 332 coupled by a gate 334. The pull-up and access devices are as in FIG. 2.

Figure 4:
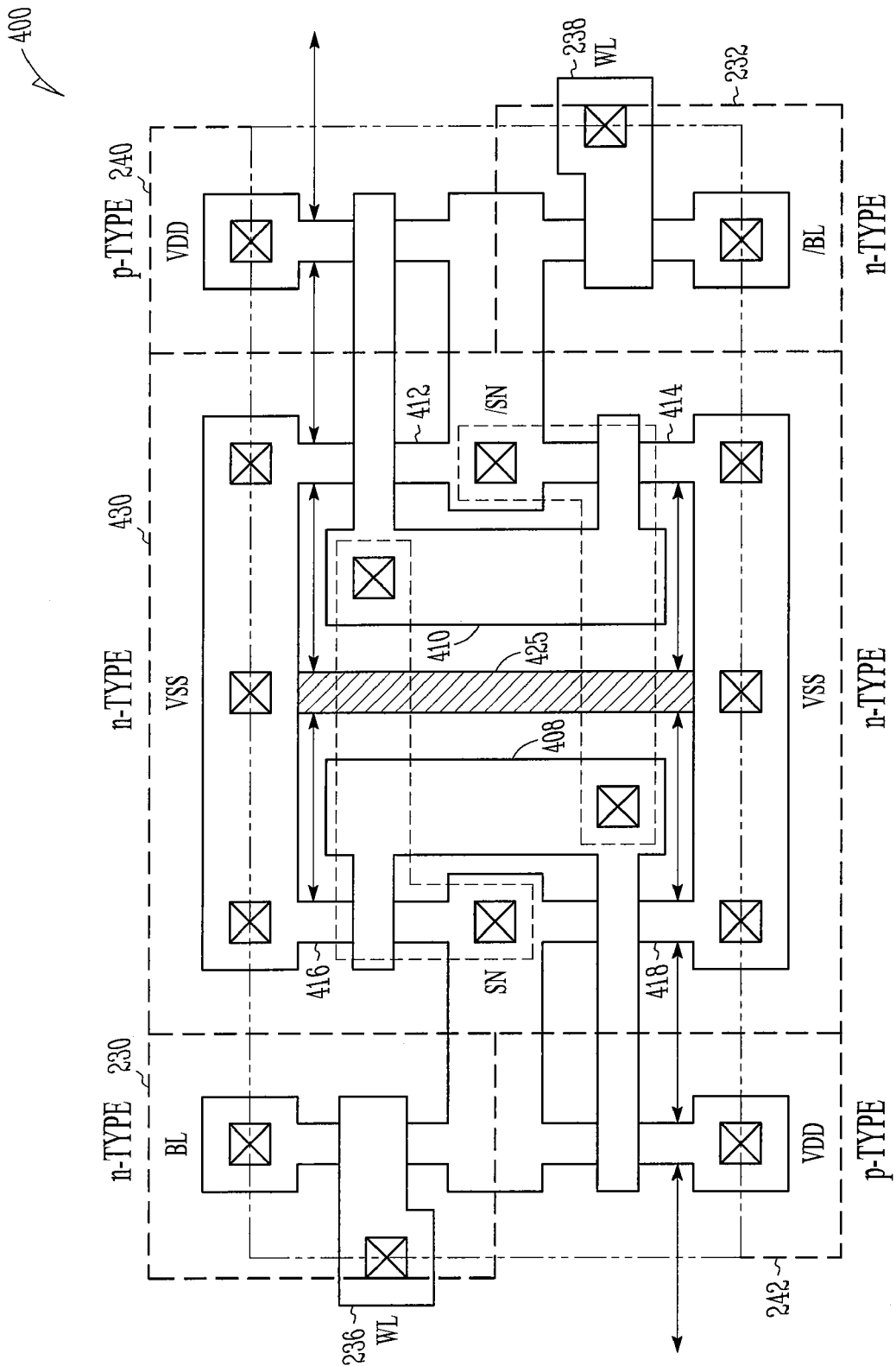
FIG. 4 is a further alternative example SRAM core cell layout having areas of fins for which different fin characteristics may be obtained according to an example embodiment.

FIG. 4 is a further alternative example core cell layout 400 having areas of fins for which different fin characteristics may be obtained according to an example embodiment. This embodiment, is similar to layout 300, but is slightly larger in area, and avoids the chance of a short that might occur in layout 300 between gates of the access devices 236, 238 and poly lines 326, 334 where they are closest. This is done by putting contacts 408, 410 between fins 412, 414, 416 and 418 of the pull-down transistors. In this embodiment, a dummy fin 425 may be formed between 412, 414, 416 and 418, and later be removed if desired, such as by etching or other suitable process. This again creates a column 430 of devices having fins which may be processed differently than the other fins, allowing creation of pull-down devices with higher current driving performance than other devices on the layout 400.

Figure 5:
FIG. 5 is a block diagram of an array of SRAM core cells folded out to produce an array of cells with stripes of areas for which different fin characteristics may be obtained according to an example embodiment.

FIG. 5 is a block diagram of an array of core cells folded out to produce an array 500 of cells with stripes of areas for which different fin characteristics may be obtained according to an example embodiment. The block diagram includes a cell formed of nFET access devices 510 in opposite corners, pFET pull up devices 515 in opposite corners, and nFET pull-down devices in a stripe 520 across the cell. The cell is folded outward, such that isolated areas of four pFET pull-up devices 515 and isolated areas of four access devices 510 are observed. Further observed are stripes 520 of pull-down devices that extend span the entire array 500. These patterns, including the stripes and isolated areas facilitate processing to provide the different characteristics of the devices in the stripes. Devices in the stripes may be made stronger, or devices outside the stripes may be made weaker, or a combination thereof may be used.

Figure 6:
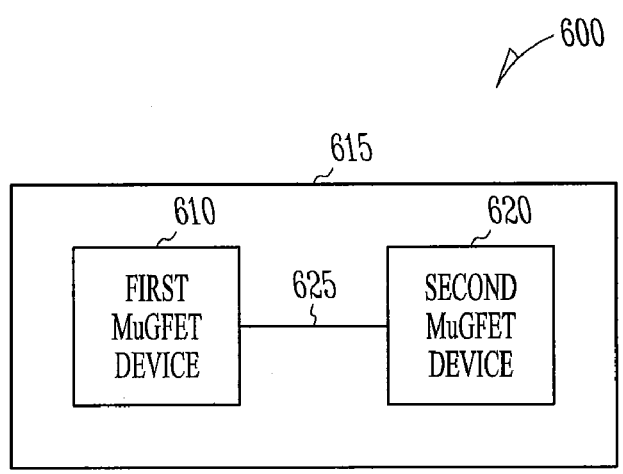
FIG. 6 is a block diagram representing different groups of circuits with different performance characteristics according to an example embodiment.

While the embodiments described relate to an SRAM array, other circuits may benefit from the grouping of devices as described. In one embodiment illustrated in FIG. 6, a circuit 600 includes a plurality of first MuGFET devices 610 formed on an insulating surface 615 and having a first performance level. A plurality of second MuGFET devices 620 may also be formed on the insulating surface 615 and have a second performance level. The first and second devices are arranged in separate areas that permit different processing of the first and second devices to tailor their performance characteristics. Circuit connections between the first and second devices are represented by line 625. This can be useful, especially in space constrained applications to obtain different performance characteristics for two or more groups of devices. The circuit may be a core circuit for replication in an array, or devices in a single circuit, perhaps a very large circuit where devices of different performance characteristics may be desired without the use of additional fins.

In one embodiment, the MuGFET devices having a first performance level may be grouped into one or more separate areas. In one embodiment, the current ratio may be significantly greater than 1, such as 1.4 or higher. In one embodiment, the MuGFET devices having a first performance level have fins higher than fins of the second MuGFET devices, such as 40 nm to 30 nm high for second performance level fins. In a further embodiment, different strains may be formed on the fins. Different implants may also be used to selectively weaken or strengthen devices in selected separate areas of devices.

The Abstract is provided to comply with 37 C.F.R. §1.72(b) to allow the reader to quickly ascertain the nature and gist of the technical disclosure. The Abstract is submitted with the understanding that it will not be used to interpret or limit the scope or meaning of the claims.

The invention claimed is:

1. An SRAM array cell comprising:
a first stripe having a MuGFET single fin access device and pull up device;
a second stripe having a MuGFET single fin access device and pull up device;
a middle stripe having two MuGFET pull down devices with a current ratio compared to the access devices greater than 1, the two MuGFET pull down devices coupled via their corresponding serially-connected double fins to at least one common ground within the middle stripe;
wherein the access devices and pull down devices are MOS single fin MuGFET transistors of a first conductivity type and the pull up devices are MOS single fin MuGFET transistors of a second conductivity type; and
further comprising multiple cells laid out in an SRAM array in a folded manner such that isolated FET islands of FETs of the second conductivity type are formed.

2. The cell array of claim 1 wherein middle stripes of pull down devices are formed extending straight through the array.

3. The cell array of claim 2 wherein the middle stripes of pull down devices when compared to the other devices have at least one of higher fins, strain or implant conditions to provide higher driving currents than the devices in the other stripes.

4. An SRAM memory cell comprising:
a plurality of first MuGFET devices supported by a substrate, the first MuGFET devices comprising pull down FET transistors of a first conductivity type and access FET transistors of the first conductivity type, at least two of the pull down FET transistors coupled via their corresponding serially-connected double fins to at least one common ground within a middle stripe; and
a plurality of second MuGFET devices supported by the substrate, the second MuGFET devices comprising pull up FET transistors of a second conductivity type;
wherein the first and second MuGFET devices have different fin heights; and
further comprising multiple cells laid out in an SRAM array in a folded manner such that isolated FET islands of FETs of the second conductivity type are formed.

5. The cell of claim 4 wherein middle stripes of pull down devices are formed extending straight through the array.

6. The cell of claim 4 wherein the current ratio of the first MuGFET devices to the second MuGFET devices is greater than 1.

7. The SRAM memory cell of claim 4 wherein the FET transistors of the first and second conductivity types are single fin FET transistors.

8. An SRAM array cell comprising:
a first stripe having a MuGFET access device and pull up device;
a second stripe having a MuGFET access device and pull up device;
a middle stripe having two MuGFET pull down devices with a current ratio compared to the access devices greater than 1, the two MuGFET pull down devices coupled via their corresponding serially-connected double fins to at least one common ground within the middle stripe;
wherein the access devices and pull down devices are MOS MuGFET transistors of a first conductivity type and the pull up devices are MOS MuGFET transistors of a second conductivity type; and
further comprising multiple cells laid out in an SRAM array in a folded manner such that isolated FET islands of FETs of the second conductivity type are formed.

9. The cell array of claim 8 wherein middle stripes of pull down devices are formed extending straight through the array.

10. The cell array of claim 8 wherein the middle stripes of pull down devices when compared to the other devices have at least one of higher fins, strain or implant conditions to provide higher driving currents than the devices in the other stripes.

11. An SRAM array cell comprising:
   a first stripe having a MuGFET single fin access device and pull up device;
   a second stripe having a MuGFET single fin access device and pull up device; and
   a middle stripe having two MuGFET pull down devices, the two MuGFET pull down devices coupled via their corresponding serially-connected double fins to at least one common ground within the middle stripe.

12. The SRAM array cell of claim 11, wherein the middle stripe comprises a removable dummy fin coupled to the at least one common ground within the middle stripe.

* * * * *